(12) United States Patent
Ishikawa et al.

(10) Patent No.: US 6,864,044 B2
(45) Date of Patent: Mar. 8, 2005

US006864044B2

(54) PHOTORESIST RESIDUE REMOVING LIQUID COMPOSITION

(75) Inventors: Norio Ishikawa, Saitama (JP); Takuo Oowada, Tokyo (JP)

(73) Assignee: Kanto Kagaku Kabushiki Kaisha, Tokyo (JP)

(*) Notice: Subject to any disclaimer, the term of this patent is extended or adjusted under 35 U.S.C. 154(b) by 0 days.

(21) Appl. No.: 10/309,797

(22) Filed: Dec. 4, 2002

(65) Prior Publication Data

US 2003/0143495 A1 Jul. 31, 2003

(30) Foreign Application Priority Data

Dec. 4, 2001 (JP) .................................. 2001-370122

(51) Int. Cl.$^7$ .............................. G03F 7/42; C11D 9/00
(52) U.S. Cl. ..................... 430/331; 430/329; 134/3; 510/176
(58) Field of Search .................... 430/331, 329; 134/3; 510/176

(56) References Cited

U.S. PATENT DOCUMENTS

| | | | |
|---|---|---|---|
| 3,689,292 A | * 9/1972 | Preston | ........................ 427/353 |
| 4,014,715 A | * 3/1977 | Preston | ........................... 134/3 |
| 5,334,332 A | 8/1994 | Lee | |
| 5,466,297 A | * 11/1995 | Goodman et al. | ............. 134/3 |
| 5,480,585 A | 1/1996 | Shiotsu et al. | |
| 5,567,574 A | 10/1996 | Hasemi et al. | |
| 5,612,304 A | * 3/1997 | Honda et al. | ............... 510/176 |
| 5,678,232 A | * 10/1997 | D'Muhala | ........................ 134/3 |
| 6,228,823 B1 | * 5/2001 | Morinaga et al. | .............. 134/3 |
| 6,231,677 B1 | 5/2001 | Ishikawa et al. | |
| 6,458,517 B2 | * 10/2002 | Nohara et al. | .............. 430/329 |
| 2002/0037479 A1 | * 3/2002 | Schwartzkopf et al. | ...... 430/329 |

FOREIGN PATENT DOCUMENTS

| | | |
|---|---|---|
| EP | 0647884 A1 | 4/1995 |
| EP | 662705 A2 | 12/1995 |
| EP | 0897975 A1 | 2/1999 |
| EP | 0939344 A1 | 9/1999 |
| EP | 1063689 A1 | 12/2000 |
| FR | 1603558 A | 5/1995 |
| GB | 2 354 086 A | 10/1999 |
| JP | 2001-83712 A | 4/1990 |
| JP | 5-281753 A | 10/1993 |
| JP | 7-201794 A | 8/1995 |
| JP | 8-262746 A | 10/1996 |
| JP | 11-316464 A | 11/1999 |
| JP | 2000-162788 A | 6/2000 |
| JP | 2000-232063 A | 8/2000 |
| JP | 2001-22095 A | 1/2001 |
| JP | 2001-22096 A | 1/2001 |

* cited by examiner

Primary Examiner—Richard L. Schilling
(74) Attorney, Agent, or Firm—Wolf, Greenfield & Sacks, P.C.

(57) ABSTRACT

The object of the present invention is to provide, in the production of semiconductor circuit elements, a photoresist residue removing liquid composition which is excellent for removing photoresist residues after dry etching without attacking the wiring material or the interlayer insulating film etc.

This is made possible by a photoresist residue removing liquid composition containing one or more members selected from the group consisting of reducing compounds and their salts and one or more members selected from the group consisting of aliphatic polycarboxylic acids and their salts.

10 Claims, 1 Drawing Sheet

PHOTORESIST RESIDUE REMOVING LIQUID COMPOSITION

FIELD OF THE INVENTION

The present invention relates to a photoresist residue removing liquid composition, and in particular relates to a photoresist residue removing liquid composition for removing photoresist residues after dry etching interlayer insulating film material, wiring material, capacitors, electrode material in the production of semiconductor circuit elements. As used herein, the term photoresist residue comprises incompletely ashed photoresist residues remaining on the substrate surface after ashing and side-wall polymers (also called side-wall protecting films, rabbit's ears) remaining on side faces of wiring and the via-holes.

BACKGROUND OF THE INVENTION

Dry etching is the most important technology used for patterning interlayer insulating film material, wiring material etc. in the production of semiconductor circuit elements.

Dry etching is a technology wherein a pattern is formed by coating a photoresist onto a substrate on which a film of interlayer insulating film material, wiring material, etc., has been formed by means of sputtering, CVD, electrolytic plating, spin coating, etc., and by exposing and developing the photoresist and wherein the pattern of interlayer insulating film and wiring pattern are then formed by dry etching with a reactive gas using said photoresist as a mask. Ordinarily, the substrate is treated by ashing after dry etching, and after removing the photoresist which had been used as a mask by ashing, residues partly remaining such as photoresist residues etc. are further removed with a photoresist stripping liquid.

However, the photoresist residues which remain after dry etching cannot be completely removed with the photoresist stripping liquids generally used in the prior art which combine an organic solvent with alkanolamine (e.g., JP, A, 5-281753; U.S. Pat. No. 5,480,585). The reason for this is thought to be that, together with the etched material, part of the photoresist residues remaining after ashing becomes inorganic. Therefore, removing liquids containing fluorine compounds (JP, A, 7-201794; EP, A, 662705), hydroxylamine (U.S. Pat. No. 5,334,332) and quarternary ammonium compounds (JP, A, 8-262746; U.S. Pat. No. 5,567,574) have been proposed for removing photoresist residues after dry etching.

However, these removing liquids for photoresist residues, if any thereof remains, corrode the wiring material; therefore, it is necessary to rinse with an organic solvent such as isopropyl alcohol etc. and to perform the treatment at a high temperature to remove the photoresist residues completely. Moreover, because the liquids include organic compounds at a ratio of some 10% to 100%, these removing liquids for photoresist residues are a heavy burden on the environment and therefore not desirable.

Further, the wiring material is also corroded when the photoresist residues are removed, because the wiring material and the photoresist residues are similar composition. Consequently, photoresist stripper compositions comprising sorbitol etc. have been proposed (JP, A, 8-262746; U.S. Pat. No. 5,567,574).

Furthermore, the inventors of the present invention have disclosed a removing liquid for photoresist residues containing aliphatic carboxylic acids and their salts (JP, A, 11-316464). This removing liquid does not contain organic solvents, which means that the burden on the environment is small, and it can be used without corroding metallic wiring of Al—Si—Cu, Al—Cu, W, Ti, TiN, etc., However, together with the miniaturization of the wiring that has been taking place in recent years, etching and ashing conditions have become more severe and resist residues have come to be more firmly attached. Therefore, treatments at high temperatures and for long durations are necessary to completely remove resist residues, as a result of which Al—Si—Cu and Al—Cu have at times been corroded. Thus, compared to the stripping liquids of the prior art, agents inhibiting corrosion with a high corrosion inhibiting effect are required.

Further, multilayer wiring structures have generally been introduced to semiconductor circuit elements wherein the upper aluminum wiring and the lower aluminum wiring are connected by forming via-holes in the interlayer insulating film and by embedding a metal such as tungsten etc. in these via-holes. With semiconductor circuit elements of relatively large dimensions, there is a complete match between the upper wiring and the via-holes, and the via-holes are covered by the upper wiring. However, together with the miniaturization of semiconductor circuit elements that has been taking place in recent years, a high degree of accuracy is being required for forming wiring and via-holes; therefore, dislocations between the wiring and the position of the via-holes, not matching completely, occur and with the via-holes not completely covered, tungsten or other embedded metals may be exposed by the side of the upper wiring.

This type of wiring structure is called borderless via structure; and when forming wiring on top of via-holes of a borderless via structure, resist residues are attached to the surface of the upper wiring and the tungsten embedded in the via-holes. When using the above-mentioned strongly alkaline removing liquids for resist residues containing hydroxylamine or quarternary ammonium compounds for removing these resist residues, there is the problem that the tungsten is dissolved due to an electrochemical reaction. Therefore, a removing liquid containing ammonium phosphate has been proposed (JP, A, 2000-232063). However, when the resist residue removing properties are insufficient, it is necessary to add a surfactant, in which case there is the environmental burden to be considered because of the phosphate compounds.

On the other hand, new wiring materials and interlayer insulating film materials have come to be used together with the increase in performance and the miniaturization of semiconductor circuit elements that has been taking place in recent years, the result of which has been that limits have appeared in the way the removing liquids for photoresist residues of the prior art have hitherto been used.

For example, with the demand for an increased performance and the miniaturization of semiconductor circuit elements, the introduction of Cu wiring has been considered with the aim of reducing the wiring resistance and it has become possible to form Cu wiring by means of the damascene process. The damascene process is a process for forming a wiring pattern wherein the wiring pattern is formed as trenches in the interlayer insulating film and wherein, after the Cu has been embedded by sputtering or electrolytic plating, the excess blanket Cu is removed by chemical mechanical polishing (CMP) etc.

As resist stripping liquid for this new wiring material, i.e., Cu wiring material, there are stripping liquids containing triazole compounds as Cu corrosion inhibitor (JP, A, 2001-22095; JP, A, 2001-22096; JP, A, 2000-162788); however, these stripping liquids, in the same way as described above, have to be used at high temperatures, need to be rinsed with isopropyl alcohol etc. and also present the problem of containing organic solvents. Further, there is also a resist stripping liquid composition comprising benzotriazole derivatives as Cu corrosion inhibiting agents (JP, A, 2001-83712); however, this composition also comprises an aqueous organic solvent and involves the above-mentioned problems. Furthermore, having poor biodegradation properties, triazole compounds and benzotriazole derivatives involve a considerable liquid waste disposal problem. Moreover, since triazole compounds and benzotriazole derivatives do not easily dissolve in water, these corrosion inhibiting agents remain on the wafer surface after rinsing with water, which can have a negative effect on subsequent work processes.

On the other hand, with the demand for an increased performance and the miniaturization of semiconductor circuit elements, the introduction of interlayer insulating films with a low dielectric constant (so-called low-k films) has also been considered in recent years. Low-k films generally are organic films represented by aromatic aryl compounds, siloxane films represented by hydrogen silsesquioxane (HSQ) and methyl silsesquioxane (MSQ) and porous silica films. When forming the trenches of the upper wiring and the via-holes connecting the lower Cu wiring with the upper wiring in the production of semiconductor circuit elements using these types of wiring material and interlayer insulating film material, the interlayer insulating film material or different low-k films are dry etched and photoresist residues are formed which have a different composition from those formed when using conventional wiring materials and interlayer insulating film materials. Further, compared to conventional wiring materials and interlayer insulating film materials, Cu and different types of low-k films have a poor chemical resistance; hence, it is not possible to use conventional photoresist residue removing liquids for aluminum wiring as they are to remove the photoresist residues remaining after dry etching. For example, the alkanolamine, quarternary ammonium compounds and fluorine compounds contained in the above-mentioned removing liquids for photoresist residues cause the corrosion of Cu which has a low corrosion resistance and the alkanolamine and quarternary ammonium compounds cause the deterioration of the film, the change of the structure, the change of the dielectric constant and a change in the mechanical strength etc. of the different low-k films. It is further desirable to remove the photoresist at low temperatures because the low-k films have a poor chemical resistance.

Thus, various corrosion inhibiting agents for these new materials have been considered, without, however, obtaining any satisfactory results up to now, as there are no acidic removing liquids with sufficient corrosion inhibiting effect which do not have a negative effect on the environment.

A problem to be solved by the present invention is to provide, in the production of semiconductor circuit elements, a photoresist residue removing liquid for removing photoresist residues which are generated when ashing and dry etching substrates provided with conventional metallic wiring using Al—Si—Cu, W, Ti, TiN, etc. under conditions more severe than in the prior art and which are attached more firmly than in the prior art without corroding the wiring.

A further problem to be solved by the present invention is to provide, in the production of semiconductor circuit elements, a photoresist residue removing liquid for removing photoresist residues which have a different composition from conventional photoresist residues and which are generated when ashing and dry etching substrates provided with metallic wiring using the new wiring material Cu without corroding the wiring.

A further problem to be solved by the present invention is to provide, in the production of semiconductor circuit elements, a photoresist residue removing liquid for removing photoresist residues which have a different composition from conventional photoresist residues and which are generated when ashing and dry etching a substrate provided with an interlayer insulating film with a low dielectric constant without leading to the deterioration of the film, the change of the structure, the change of the dielectric constant or a deterioration of the mechanical strength etc. of the interlayer insulating film.

A further problem to be solved by the present invention is to provide, in the production of semiconductor circuit elements, a photoresist residue removing liquid for removing photoresist residues which are generated when ashing and dry etching substrates provided with conventional metallic wiring using Al—Si—Cu, W, Ti, TiN, etc. under similar conditions as in the prior art without corroding the wiring.

A further problem to be solved by the present invention is to provide, in the production of semiconductor circuit elements, a photoresist residue removing liquid for removing photoresist residues which are generated when ashing and dry etching substrates provided with metallic wiring which is connected by via-holes and wherein the metal embedded in the via-holes is partly exposed without dissolving the exposed metal embedded in the via-holes.

A further problem to be solved by the present invention is to provide, in the production of semiconductor circuit elements, a photoresist residue removing liquid for effectively removing photoresist residues which are generated when ashing and dry etching even at low temperatures.

SUMMARY OF THE INVENTION

The inventors of the present invention, as a result of extensive research to solve the above-mentioned problems and to develop a photoresist residue removing liquid composition which does not lead to the deterioration of the film, the change of the structure, the change of the dielectric constant and a change in the mechanical strength etc. of new materials, i.e., low-k films, found that these problems can be solved by a photoresist residue removing liquid composition containing one or more reducing compounds and one or more members selected from the group consisting of aliphatic polycarboxylic acids and their salts, and then have completed the invention.

Therefore, the present invention relates to a photoresist residue removing liquid composition containing one or more members selected from the group consisting of reducing compounds and their salts and one or more members selected from the group consisting of aliphatic polycarboxylic acids and their salts.

The present invention further relates to the beforementioned photoresist residue removing liquid composition as an aqueous solution.

The present invention also relates to the before-mentioned photoresist residue removing liquid composition wherein the aliphatic polycarboxylic acid(s) is (are) one or more members selected from the group consisting of oxalic acid, malonic acid, tartaric acid, malic acid, succinic acid and citric acid.

The present invention further relates to the beforementioned photoresist residue removing liquid composition wherein the reducing compound(s) is (are) one or more members selected from the group consisting of glyoxylic acid, ascorbic acid, glucose and mannose.

The present invention also relates to the before-mentioned photoresist residue removing liquid composition wherein the concentration of the reducing compound(s) is 0.001 wt % to 10 wt %.

The present invention further relates to the use for removing photoresist residues of the before-mentioned photoresist residue removing liquid composition.

Compared to conventional removing liquids, the photoresist residue removing liquid composition according to the present invention, because it contains reducing compounds, has excellent properties for removing photoresist residues remaining after dry etching even when Cu, Al or W etc. are used as metallic material, and inhibits the corrosion of these metallic materials. Hence, it is possible to remove even photoresist residues which are firmly attached because of etching and ashing under severe conditions without corroding metallic materials. Further, it is possible to use the photoresist residue removing liquid composition according to the present invention for high precision wiring materials even with Cu, which has a low corrosion resistance, and with new materials, i.e., low-k films, without leading to the deterioration of the film, the change of the dielectric constant and a change in the mechanical strength etc., which used to be a problem in the prior art. Moreover, the environmental burden is small when used as an aqueous solution. Furthermore, photoresist residues can be removed at low temperatures and without rinsing with organic solvents such as alcohol etc.

The reducing compounds used in the photoresist residue removing liquid composition according to the present invention mean compounds, among organic compounds having an aldehyde group such as glyoxylic acid, glutaraldehyde and glyoxal; saccharic acids having a reactive multiple bond such as ascorbic acid and gluconoheptonic acid; reducing sugars such as arabinose, galactose, glucose, glucoheptose, glucoheptulose, sorbose, fructose, mannose and lactose; aromatic hydroxy compounds such as catechol, pyrogallol and gallic acids and their derivatives; organic compounds having a reactive multiple bond such as 2-butin-1,4-diol, 2-butin-1-ol and 3-butin-1-ol; etc., which function as metal corrosion inhibiting agents when used in combination with aliphatic polycarboxylic acids. Among compounds with reducibility there are those like amines such as dimethylamine borane, trimethylamine borane, etc. which are not stable in an aqueous solution; those like hydrazine and hydroxylamine which forming water soluble complexes with Cu corrode Cu; and phosphinic acids and their salts etc. which also corrode Cu; these compounds, even though they have reducibility, are not included in the reducing compounds according to the present invention.

According to the present invention, particularly preferred reducing compounds include, e.g., glyoxylic acid, ascorbic acid, glucose and mannose.

The reducing compounds used in the photoresist residue removing liquid composition according to the present invention function as Cu and Al corrosion inhibiting agents. While the mechanisms for this are not necessarily clear, it can be considered that one reason is the control of the redox potential of the removing liquid; i.e., by controlling the transfer of electrons between different metals corrosion is inhibited.

Ordinarily, it can be said that the pH value of the aqueous solution, the redox potential, temperature, the existence of a chelating agent, and the coexistence of other metals in the aqueous solution have an influence on the corrosion of metal in an aqueous solution; however, among these the pH value of the solution and the redox potential are the most important factors. Consequently, it can be assumed that the above-mentioned reducing compounds, by controlling these factors, inhibit the corrosion of metal in an aqueous solution.

By way of example, a diagram of the pH-redox potential showing the state of Cu in an aqueous solution is given in FIG. 1 (M. Pourbaix: Atlas of Electrochemical Equilibria in Aqueous Solutions, National Association of Corrosion Engineers, Houston, 1974). Cu in an acidic solution is represented by Cu (metal area) and $Cu^{2+}$ (dissolution area); for the redox potential of the acidic solution is high, $Cu^{2+}$ generally dissolves in the solution. Therefore, the redox potential of the solution needs to be lowered to the metal area to inhibit the corrosion of Cu; and it is thought that this can be achieved by adding reducing compounds to the acidic solution. However, this does not mean that all compounds having reducibility function as corrosion inhibiting agents; e.g. amines such as hydrazine, hydroxylamine, etc. and phosphinic acids have a strong corrosive effect on Cu etc. even though they are compounds having reducibility. This shows that, apart from the redox potential, corrosion also depends very much on the pH value and on coexisting ions; the reducing compounds according to the present invention, combined with aliphatic polycarboxylic acids such as oxalic acid etc., are suitably selected while taking into consideration these factors.

Therefore, in the production of semiconductor circuit elements, the photoresist residue removing liquid according to the present invention can remove photoresist residues which are generated when ashing and dry etching substrates provided with conventional metallic wiring using Al—Si—Cu, W, Ti, TiN, etc. under conditions more severe than in the prior art and which are attached more firmly than in the prior art without corroding the wiring.

Further, the photoresist residue removing liquid according to the present invention can remove even those photoresist residues that have a different composition from conventional photoresist residues and which are generated when ashing and dry etching substrates provided with metallic wiring using the new wiring material Cu without corroding the wiring.

Further, the photoresist residue removing liquid according to the present invention can remove photoresist residues which have a different composition from conventional photoresist residues and which are generated when ashing and dry etching a substrate provided with an interlayer insulating film with a low dielectric constant without leading to the deterioration of the film, the change of the structure, the change of the dielectric constant or a deterioration of the mechanical strength etc. of the interlayer insulating film.

Further, the photoresist residue removing liquid according to the present invention can remove photoresist residues which are generated when ashing and dry etching substrates provided with conventional metallic wiring using Al—Si—Cu, W, Ti, TiN, etc. under similar conditions as in the prior art without corroding the wiring.

Further, the photoresist residue removing liquid according to the present invention can remove photoresist residues which are generated when ashing and dry etching substrates provided with metallic wiring which is connected by via-holes and wherein the metal embedded in the via-holes is partly exposed without dissolving the exposed metal embedded in the via-holes.

Further, the photoresist residue removing liquid according to the present invention can effectively remove photoresist residues even at low temperatures.

DETAILED DESCRIPTION OF PREFERRED EMBODIMENTS

Figure 1:
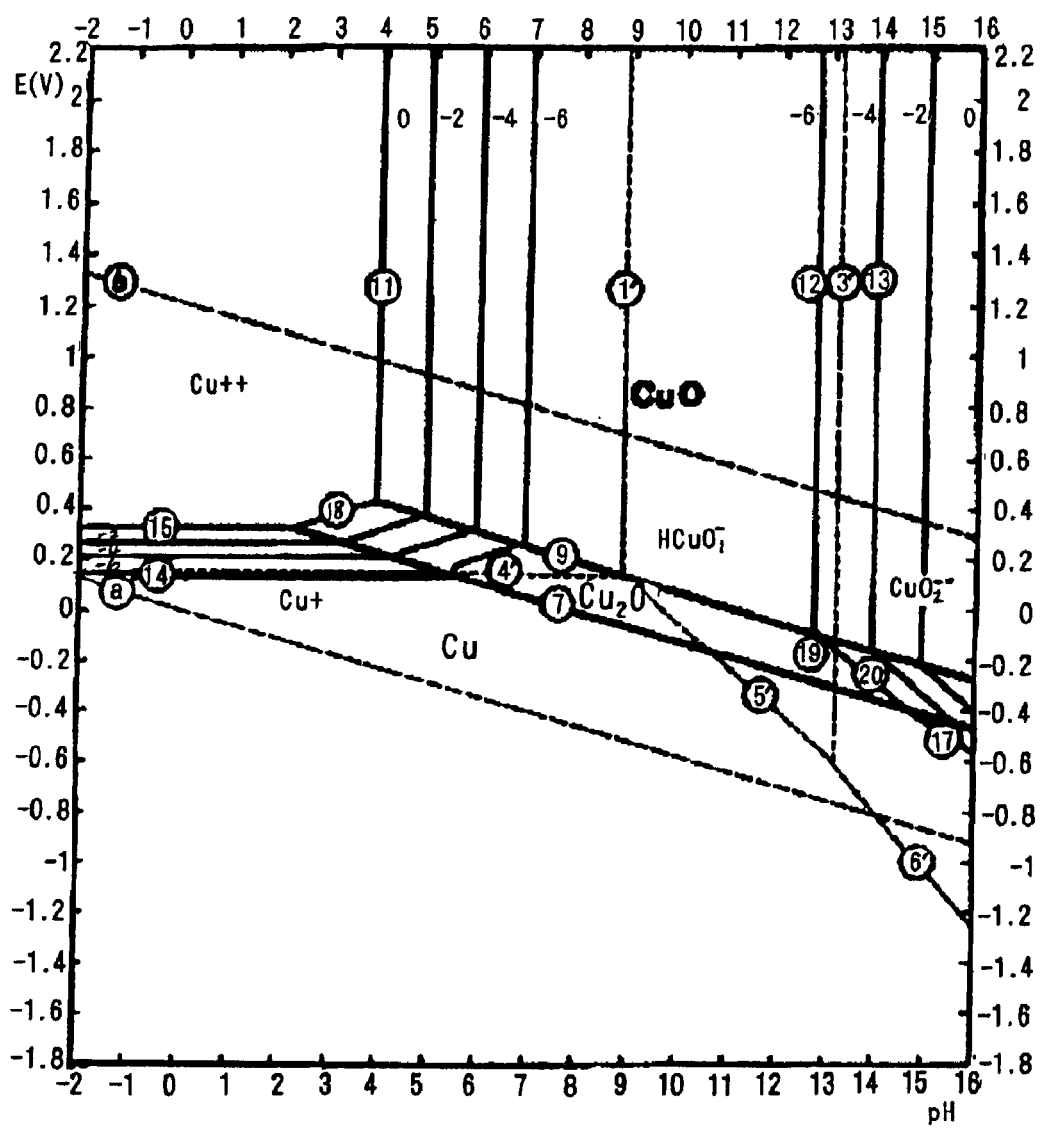
FIG. 1 is a diagram of the pH-redox potential showing the state of Cu in an aqueous solution.

Examples of aliphatic polycarboxylic acids and their salts used in the photoresist residue removing liquid composition according to the present invention include, e.g., dicarboxylic acids such as oxalic acid, malonic acid, succinic acid, etc. and salts thereof; oxidicarboxylic acids such as malic acid and tartaric acid etc. and salts thereof; and oxitricarboxylic acids such as citric acid and salts thereof.

The composition of the photoresist residues remaining after ashing differs according to the etched material. When dry etching interlayer insulating films etc. on copper wiring, the photoresist residues present on the bottom surface and on the side walls of via-holes after ashing contain copper oxides. Accordingly, aliphatic polycarboxylic acids can be mentioned as component for removing the photoresist residues; properly selected, they can dissolve and remove the photoresist residues. Further, when dry etching aluminum wiring, the photoresist residues present on the surface and on the side walls of the wiring after ashing mainly contain aluminum oxides. Accordingly, aliphatic polycarboxylic acids can be mentioned as component for removing the photoresist residues; properly selected, they can dissolve and remove the photoresist residues.

Thus, since aliphatic polycarboxylic acids have excellent properties for removing copper oxides and aluminum oxides and keep the corrosion of copper and aluminum to a minimum, they are used in the photoresist residue removing liquid composition according to the present invention as component for removing photoresist residues; among the aliphatic polycarboxylic acids oxalic acid is preferred.

Examples of the reducing compounds used in the photoresist residue removing liquid composition according to the present invention include, as mentioned before, organic compounds having an aldehyde group such as glyoxylic acid, glutaraldehyde and glyoxal; saccharic acids having a reactive multiple bond such as ascorbic acid and gluconoheptonic acid; reducing sugars such as arabinose, galactose, glucose, glucoheptose, glucoheptulose, sorbose, fructose, mannose and lactose; aromatic hydroxy compounds such as catechol, pyrogallol and gallic acids and their derivatives; and organic compounds having a reactive multiple bond such as 2-butin-1,4-diol, 2-butin-1-ol and 3-butin-1-ol; etc.; and examples of particularly preferred reducing compounds include e.g. glyoxylic acid, ascorbic acid, glucose and mannose.

The photoresist residue removing liquid composition according to the present invention containing aliphatic polycarboxylic acids can be treated by an activated sludge process through neutralization and biodegradation. Moreover, since they do not contain fluorine compounds or phosphate compounds, there is no need for a separate recovery of waste liquids nor for a treatment by a waste disposal company, while the environmental burden is small, and the possibility of reducing the liquid waste disposal expenses is also an advantage.

The concentration of the aliphatic polycarboxylic acids is determined according to the type of residues to be removed; however, a concentration of 0.05 wt % to 10 wt % is preferred, and a concentration of 0.1 wt % to 5.0 wt % is particularly preferred.

The reducing compounds are used to inhibit the corrosion of metals used in the wiring material etc.; the concentration used is determined according to photoresist residue removing properties, the capacity for attacking the wiring material and the interlayer insulating film material, the economic efficiency and whether or not there are deposits or crystallization; however, a concentration in the range from 0.001 wt % to 10 wt % is preferred, and a concentration of 0.01 wt % to 5 wt % is even more preferred.

The working temperatures of the photoresist residue removing liquid composition according to the present invention are, when considering the corrosion of materials, preferably low temperatures, i.e. temperatures in the range from 25° C. to 40° C. are preferred.

EXAMPLES

Hereinafter, the photoresist residue removing liquid composition according to the present invention will be explained in greater detail with the help of the Examples and the Comparative Examples; however, the present invention is not limited to these Examples.

1) Photoresist Residue Removing Evaluation Test 1. (Cu/low-k)

Cu layers and interlayer insulating films (low-k films) were successively formed on a silicon wafer, a resist was coated onto the interlayer insulating film as mask, exposed and developed, dry etching was performed and via-holes were formed, and after removing the resist by ashing, a wafer on which photoresist residues were formed was obtained. Next, this wafer was treated by soaking it in a photoresist residue removing liquid for 10 minutes at 25° C. and after rinsing with very pure flowing water and drying, the photoresist residue removing properties, Cu corrosion and the attack on the low-k films were ascertained by means of an electron microscope. The results are shown in Table 1.

TABLE 1

| | Photoresist residue removing liquid composition (wt %) | | | Evaluation | |
|---|---|---|---|---|---|
| | Photoresist residues removing component | Corrosion inhibiting agent | Water | Photoresist residue removing properties[1] | Cu corrosion[2] |
| Comp. Example 1 | TMAH[3] 1 | — | 99 | 1 | 4 |
| Comp. Example 2 | Diglycolamine 1 | — | 99 | 1 | 4 |
| Comp. Example 3 | NH4F 1 | — | 99 | 1 | 4 |
| Comp. Example 4 | Oxalic acid 3.4 | — | 96.6 | 1 | 3 |
| Comp. Example 5 | Oxalic acid 3.4 | D-sorbitol 5 | 91.6 | 1 | 3 |
| Comp. Example 6 | Oxalic acid 3.4 | Benzotriazole 1 | 95.6 | 1 | 3 |

TABLE 1-continued

|  | Photoresist residue removing liquid composition (wt %) | | | Evaluation | |
|---|---|---|---|---|---|
|  | Photoresist residues removing component | Corrosion inhibiting agent | Water | Photoresist residue removing properties[1] | Cu corrosion[2] |
| Comp. Example 7 | Malonic acid 3.4 | — | 96.6 | 1 | 4 |
| Comp. Example 8 | Tartaric acid 3.4 | — | 96.6 | 2 | 2 |
| Comp. Example 9 | Citric acid 3.4 | — | 96.6 | 2 | 2 |
| Example 1 | Oxalic acid 3.4 | Glyoxylic acid 0.05 | 96.55 | 1 | 1 |
| Example 2 | Oxalic acid 3.4 | Glyoxylic acid 0.1 | 96.5 | 1 | 1 |
| Example 3 | Oxalic acid 3.4 | Glyoxylic acid 10 | 86.6 | 1 | 1 |
| Example 4 | Oxalic acid 3.4 | Ascorbic acid 0.05 | 96.55 | 1 | 1 |
| Example 5 | Oxalic acid 3.4 | Ascorbic acid 0.1 | 96.5 | 1 | 1 |
| Example 6 | Oxalic acid 3.4 | Ascorbic acid 10 | 86.6 | 1 | 1 |
| Example 7 | Oxalic acid 3.4 | Glucose 0.05 | 96.55 | 1 | 1 |
| Example 8 | Oxalic acid 3.4 | Glucose 0.1 | 96.5 | 1 | 1 |
| Example 9 | Oxalic acid 3.4 | Mannose 0.05 | 96.55 | 1 | 1 |
| Example 10 | Oxalic acid 3.4 | Mannose 0.1 | 96.5 | 1 | 1 |
| Example 11 | Malonic acid 3.4 | Glyoxylic acid 0.1 | 96.5 | 1 | 2 |
| Example 12 | Tartaric acid 3.4 | Glyoxylic acid 0.1 | 96.5 | 2 | 1 |
| Example 13 | Citric acid 3.4 | Glyoxylic acid 0.1 | 96.5 | 2 | 1 |

[1]Photoresist residue removing properties: 1 very good, 2 good, 3 satisfactory, 4 not satisfactory
[2]Cu corrosion: 1 no corrosion, 2 slight surface stains, 3 surface stains, 5 film deterioration
[3]TMAH: Tetramethylammoniumhydroxide 2) Photoresist Residue Removing Evaluation Test 2. (Al—Cu)

An Al—Cu layer was formed on a silicon wafer, a resist was coated onto this Al—Cu layer as mask, exposed and developed, dry etching was performed and an Al—Cu wiring was formed, and after removing the resist by ashing, a wafer on which photoresist residues were formed was obtained. Next, this wafer was treated by soaking it in a photoresist residue removing liquid for 10 minutes at 25° C., and after rinsing with very pure flowing water and drying, the photoresist residue removing properties, the Al—Cu corrosion were ascertained by means of an electron microscope. The results are shown in Table 2.

3) Photoresist Residue Removing Evaluation Test 3. (Borderless via Structure)

An interlayer insulating film was formed on a silicon wafer, a resist was coated as mask, exposed and developed, etched holes were filled with W. Thereafter, an Al—Cu layer was formed, a resist was coated onto this Al—Cu layer as mask, exposed and developed, dry etching was performed and an Al—Cu wiring was formed, and after removing the resist by ashing, a wafer on which photoresist residues were formed was obtained. Next, this wafer was treated by soaking it in a photoresist residue removing liquid for 10 minutes at 25° C., and after rinsing with very pure flowing water and drying, the photoresist residue removing properties, the Al—Cu and W corrosion were ascertained by means of an electron microscope. The results are shown in Table 3.

TABLE 2

|  | Photoresist residue removing liquid composition (wt %) | | | Evaluation | |
|---|---|---|---|---|---|
|  | Photoresist residues removing component | Corrosion inhibiting agent | Water | Photoresist residue removing properties[1] | Al—Cu corrosion[2] |
| Comp. Example 10 | TMAH[3] 1 | — | 99 | 1 | 4 |
| Comp. Example 11 | Diglycolamine 1 | — | 99 | 2 | 4 |
| Comp. Example 12 | NH4F 1 | — | 99 | 1 | 4 |
| Comp. Example 13 | Oxalic acid 3.4 | — | 96.6 | 1 | 3 |
| Comp. Example 14 | Oxalic acid 3.4 | D-sorbitol 5 | 91.6 | 1 | 3 |
| Comp. Example 15 | Malonic acid 3.4 | — | 96.6 | 1 | 2 |
| Comp. Example 16 | Tartaric acid 3.4 | — | 96.6 | 4 | 2 |
| Comp. Example 17 | Citric acid 3.4 | — | 96.6 | 4 | 2 |
| Example 14 | Oxalic acid 3.4 | Glyoxylic acid 0.05 | 96.55 | 1 | 1 |
| Example 15 | Oxalic acid 3.4 | Glyoxylic acid 0.1 | 96.5 | 1 | 1 |
| Example 16 | Oxalic acid 3.4 | Glyoxylic acid 10 | 86.6 | 1 | 1 |
| Example 17 | Oxalic acid 3.4 | Ascorbic acid 0.05 | 96.55 | 1 | 1 |
| Example 18 | Oxalic acid 3.4 | Ascorbic acid 0.1 | 96.5 | 1 | 1 |
| Example 19 | Oxalic acid 3.4 | Ascorbic acid 10 | 86.6 | 1 | 1 |
| Example 20 | Oxalic acid 3.4 | Glucose 0.05 | 96.55 | 1 | 2 |
| Example 21 | Oxalic acid 3.4 | Glucose 0.1 | 96.5 | 1 | 2 |
| Example 22 | Malonic acid 3.4 | Glyoxylic acid 0.1 | 96.5 | 1 | 1 |

[1]Photoresist residue removing properties: 1 very good, 2 good, 3 satisfactory, 4 not satisfactory
[2]Cu corrosion: 1 no corrosion, 2 slight surface stains, 3 surface stains, 4 film deterioration
[3]TMAH: Tetramethylammoniumhydroxide

TABLE 3

| | Photoresist residue removing liquid composition (wt %) | | | Evaluation | | |
|---|---|---|---|---|---|---|
| | Photoresist residues removing component | Corrosion inhibiting agent | Water | Photoresist residue removing properties[1] | Al—Cu corrosion[2] | W corrosion[3] |
| Comp. Example 18 | TMAH[4] 1 | — | 99 | 1 | 4 | 4 |
| Comp. Example 19 | Diglycolamine 1 | — | 99 | 2 | 4 | 4 |
| Comp. Example 20 | NH4F 1 | — | 99 | 1 | 4 | 3 |
| Comp. Example 21 | Oxalic acid 3.4 | — | 96.6 | 1 | 3 | 1 |
| Comp. Example 22 | Oxalic acid 3.4 | D-sorbitol 5 | 91.6 | 1 | 3 | 1 |
| Example 23 | Oxalic acid 3.4 | Glyoxylic acid 0.05 | 96.55 | 1 | 1 | 1 |
| Example 24 | Oxalic acid 3.4 | Glyoxylic acid 0.1 | 96.5 | 1 | 1 | 1 |
| Example 25 | Oxalic acid 3.4 | Ascorbic acid 0.05 | 96.55 | 1 | 1 | 1 |
| Example 26 | Oxalic acid 3.4 | Ascorbic acid 0.1 | 96.5 | 1 | 1 | 1 |
| Example 27 | Oxalic acid 3.4 | Glucose 0.05 | 96.55 | 1 | 2 | 1 |
| Example 28 | Oxalic acid 3.4 | Glucose 0.1 | 96.5 | 1 | 2 | 1 |

[1]Photoresist residue removing properties: 1 very good, 2 good, 3 satisfactory, 4 not satisfactory
[2]Al—Cu corrosion: 1 no corrosion, 2 slight surface stains, 3 surface stains, 4 film deterioration
[3]W corrosion: 1 no corrosion, 2 slight surface stains, 3 surface stains, 4 film deterioration
[4]TMAH: Tetramethylammoniumhydroxide From the above results it can be seen that, in the production of semiconductor circuit elements using different interlayer insulating film materials and wiring materials, the photoresist residue removing liquid according to the present invention is capable of removing photoresist residues remaining after dry etching without attacking the wiring material and the interlayer insulating film material.

Effect of the Invention

By using the photoresist residue removing liquid composition according to the present invention in the production of semiconductor circuit elements it is possible to remove the photoresist residues remaining after dry etching with excellent photoresist residue removing properties and without attacking the wiring material and the interlayer insulating films etc.

Equivalents

Those skilled in the art will recognize, or be able to ascertain using no more than routine experimentation, many equivalents to the specific embodiments of the invention described herein. Such equivalents are intended to be encompassed by the following claims.

All references disclosed herein are incorporated by reference in their entirety.

We claim:

1. A photoresist residue removing liquid composition containing one or more members selected from the group consisting of reducing compounds and their salts and one or more further members selected from the group consisting of aliphatic polycarboxylic acids and their salts,
    wherein the reducing compounds are selected from the group consisting of organic compounds having an aldehyde group; gluconoheptonic acid; reducing sugars; and organic compounds having a reactive multiple bond; and
    wherein the aliphatic polycarboxylic acids are selected from the group consisting of dicarboxylic acids; and oxidicarboxylic acids.

2. The photoresist residue removing liquid composition according to claim 1 as an aqueous solution.

3. The photoresist residue removing liquid composition according to claim 1 wherein the aliphatic polycarboxylic acid(s) is (are) one or more members selected from the group consisting of oxalic acid, malonic acid, tartaric acid, malic acid, and succinic acid.

4. The photoresist residue removing liquid composition according to claim 1 wherein the reducing compound(s) is (are) one or more members selected from the group consisting of glyoxylic acid, glucose and mannose.

5. The photoresist residue removing liquid composition according to claim 1 wherein the concentration of the reducing compound(s) is 0.001 wt % to 10 wt %.

6. The photoresist residue removing liquid composition according to claim 1 wherein the organic compound(s) having an aldehyde group is (are) selected from the group consisting of glyoxylic acid, glutaraldehyde and glyoxal.

7. The photoresist residue removing liquid composition according to claim 1 wherein the reducing sugar(s) is (are) selected from the group consisting of arabinose, galactose, glucose, glucoheptose, glucoheptulose, sorbose, fructose, mannose and lactose.

8. The photoresist residue removing liquid composition according to claim 1 wherein the organic compound(s) having a reactive multiple bond is (are) selected from the group consisting of 2-butin-1,4-diol, 2-butin-1-ol and 3-butin-1-ol.

9. The photoresist residue removing liquid composition according to claim 1 wherein the dicarboxylic acid(s) is (are) selected from the group consisting of oxalic acid, malonic acid, succinic acid.

10. The photoresist residue removing liquid composition according to claim 1 wherein the oxidicarboxylic acid(s) is (are) selected from the group consisting of malic acid and tartaric acid.

* * * * *